(12) United States Patent
Fujihara et al.

(10) Patent No.: US 12,256,497 B2
(45) Date of Patent: Mar. 18, 2025

(54) OPTICAL MODULE

(71) Applicant: Mitsubishi Electric Corporation, Tokyo (JP)

(72) Inventors: Ryota Fujihara, Tokyo (JP); Seiji Nakano, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 226 days.

(21) Appl. No.: 18/179,606

(22) Filed: Mar. 7, 2023

(65) Prior Publication Data

US 2023/0209718 A1    Jun. 29, 2023

Related U.S. Application Data

(63) Continuation of application No. PCT/JP2020/043684, filed on Nov. 24, 2020.

(51) Int. Cl.
*H05K 1/18* (2006.01)
*H05K 1/11* (2006.01)

(52) U.S. Cl.
CPC ............ *H05K 1/189* (2013.01); *H05K 1/118* (2013.01); *H05K 2201/10121* (2013.01)

(58) Field of Classification Search
CPC ......... H05K 1/189; H05K 2201/10121; H01K 1/118
USPC ....................................................... 361/749
See application file for complete search history.

(56) References Cited

U.S. PATENT DOCUMENTS

| | | | |
|---|---|---|---|
| 10,135,223 B2* | 11/2018 | Noguchi | H01S 5/02345 |
| 10,411,167 B2* | 9/2019 | Koyama | H01L 24/48 |
| 2020/0187361 A1* | 6/2020 | Ikeda | H05K 1/184 |

FOREIGN PATENT DOCUMENTS

| | | |
|---|---|---|
| JP | 2006-80418 A | 3/2006 |
| JP | 2011-108940 A | 6/2011 |
| JP | 2012-256692 A | 12/2012 |
| JP | 2020-96039 A | 6/2020 |

OTHER PUBLICATIONS

Chinese Office Action and Search Report for Chinese Application No. 202080107228.4, dated Sep. 4, 2024, with English translation.

* cited by examiner

*Primary Examiner* — Binh B Tran
(74) *Attorney, Agent, or Firm* — Birch, Stewart, Kolasch & Birch, LLP

(57) ABSTRACT

An optical module includes: a stem made of metal; a ground pin including a pin portion and a joint portion having a diameter larger than a diameter of the pin portion and joined to an outer flat surface of the stem; a flexible printed circuit including a wiring pattern on a front surface and a ground pattern having an exposed surface at a position facing the outer flat surface of the stem on a back surface, in which a tip portion of the pin portion of the ground pin penetrating a second through hole is electrically connected to the second through hole on the front surface; and a plate made of metal, having a back surface joined to the outer flat surface of the stem and a front surface joined to the exposed surface of the ground pattern.

5 Claims, 4 Drawing Sheets

OPTICAL MODULE

CROSS REFERENCE TO RELATED APPLICATIONS

This application is a Continuation of PCT International Application No. PCT/JP2020/043684, filed on Nov. 24, 2020, all of which is hereby expressly incorporated by reference into the present application.

TECHNICAL FIELD

The present disclosure relates to an optical module including a flexible printed circuit (FPC).

BACKGROUND ART

Patent Literature 1 is known as an optical module including a flexible printed circuit (FPC).

Patent Literature 1 discloses a transistor outlined CAN (TO-CAN) type transmitter optical sub-assembly (TOSA) module in which a ground surface of a stem and a ground surface of a flexible printed circuit are brought into contact with each other in order to suppress energy loss at a coupling portion between the stem and the flexible printed circuit.

CITATION LIST

Patent Literature

Patent Literature 1: JP 2011-108940 A

SUMMARY OF INVENTION

Technical Problem

On the other hand, there is also known an optical module in which a ground pin is fixed to an outer surface of a stem by welding to connect the ground pin and a ground surface of a flexible printed circuit.

The ground pin is thin in this type of the optical module, and if the ground pin is welded to the outer surface of the stem while being kept thin, the fixing between the outer surface of the stem and the ground pin tends to be insufficient, and thus it is common to provide a welded part having a diameter larger than the diameter of the other portion, at a welded portion with the outer surface of the stem, that is, a root portion of the ground pin.

When the technique disclosed in Patent Literature 1 for bringing the ground surface of the stem and the ground surface of the flexible printed circuit into contact with each other is applied to this type of the optical module, the hole diameter of a through hole provided in the flexible printed circuit through which the ground pin penetrates needs to be enlarged to match the welded part of the ground pin.

When the hole diameter of the through hole is enlarged, there is a problem that the area that can be used for wiring to be formed on the flexible printed circuit is reduced, so that the degree of freedom in wiring design is reduced.

The present disclosure has been made in view of the above points, and an object thereof is to obtain an optical module including a flexible printed circuit and including a ground pin in which a tip portion of a pin portion is electrically connected to a ground pattern of the flexible printed circuit, and that includes a joint portion having a diameter larger than the diameter of the pin portion at an end of the pin portion and joined to an outer surface of a stem, in which a diameter of a through hole for the ground pin can be set to a size that matches a diameter of the pin portion, and a degree of freedom in wiring design in the flexible printed circuit is not impaired.

Solution to Problem

An optical module according to the present disclosure includes: a stem made of metal having an inner flat surface and an outer flat surface and having a through hole formed to penetrate between the inner flat surface and the outer flat surface; a signal lead pin that penetrates the through hole of the stem, is electrically insulated and fixed to the stem, and includes an inner lead portion projecting from the inner flat surface of the stem and an outer lead portion projecting from the outer flat surface of the stem; a ground pin including a pin portion, and at an end of the pin portion, a joint portion having a diameter larger than a diameter of the pin portion and joined to the outer flat surface of the stem; a flexible printed circuit including a wiring pattern on a front surface and a ground pattern having an exposed surface at a position facing the outer flat surface of the stem on a back surface, in which a first through hole is formed at a position facing the signal lead pin in the wiring pattern, the outer lead portion of the signal lead pin penetrates the first through hole, a tip portion of the outer lead portion of the signal lead pin is electrically connected to the wiring pattern, a second through hole is formed at a position facing the ground pin in the exposed surface of the ground pattern, the pin portion of the ground pin penetrates the second through hole, and a tip portion of the pin portion of the ground pin is electrically connected to the second through hole on the front surface; and a plate made of metal having a back surface joined to the outer flat surface of the stem and a front surface joined to the exposed surface of the ground pattern.

Advantageous Effects of Invention

According to the present disclosure, there is an effect that the degree of freedom in wiring design in a flexible printed circuit is not hindered by a ground pin including a joint portion joined to an outer surface of a stem.

DESCRIPTION OF EMBODIMENTS

First Embodiment

Figure 1:
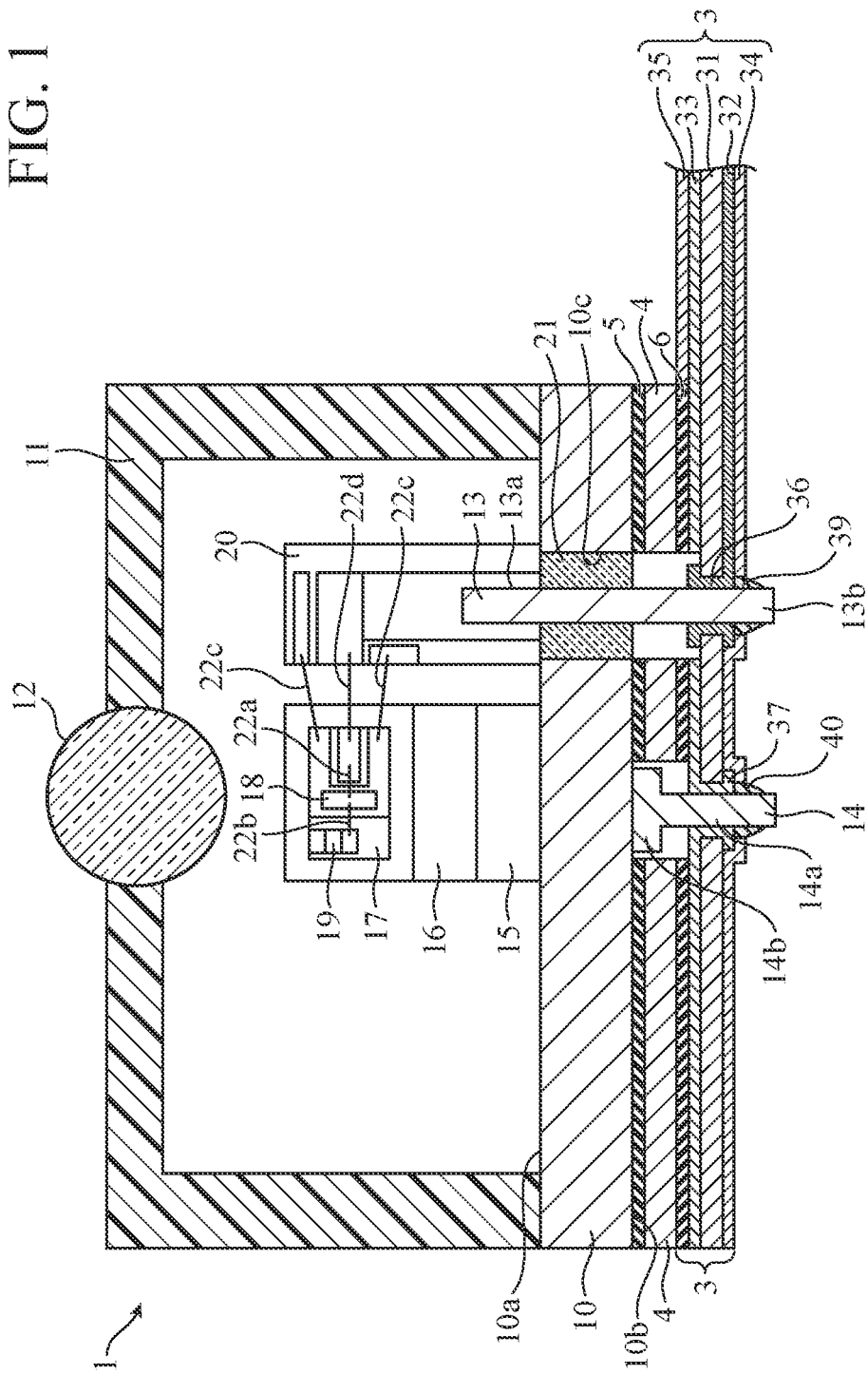
FIG. 1 is a cross-sectional view illustrating an optical module according to a first embodiment.
Figure 2:
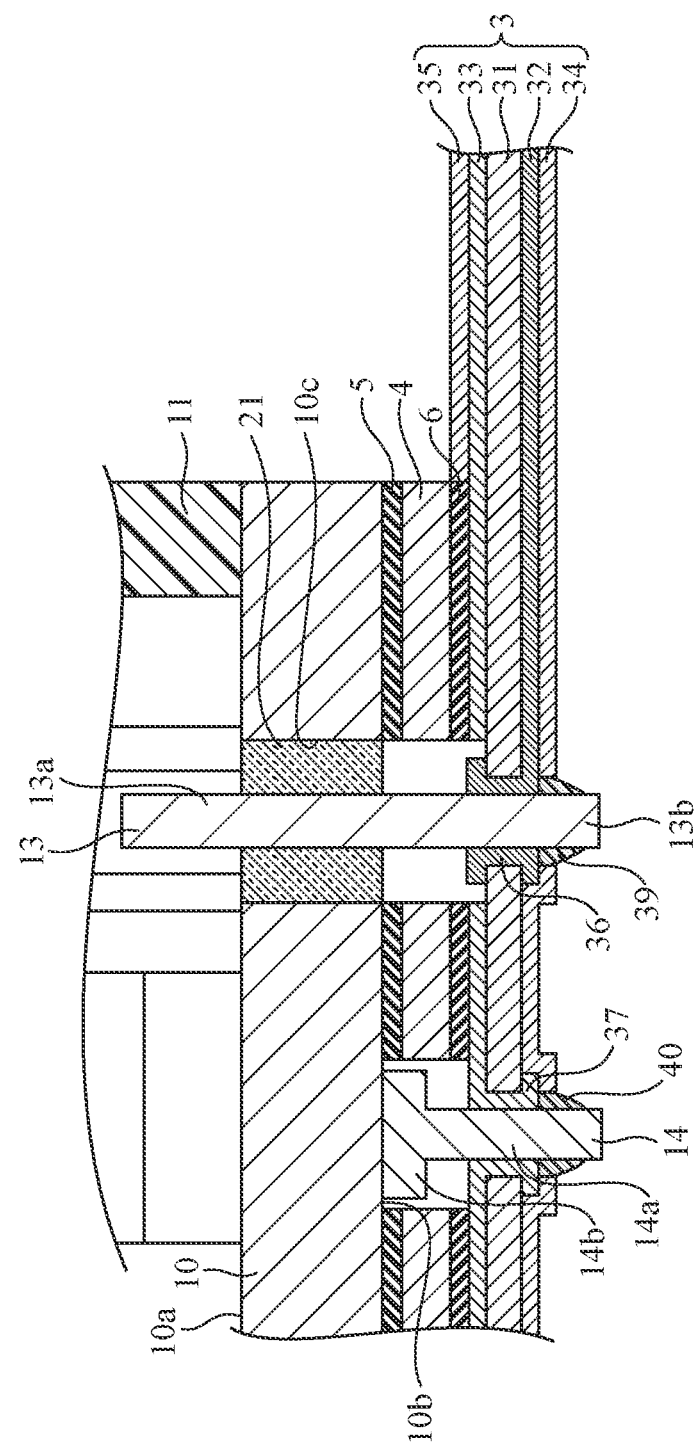
FIG. 2 is an enlarged view illustrating connection between a stem and a flexible printed circuit in the optical module according to the first embodiment.
Figure 3:
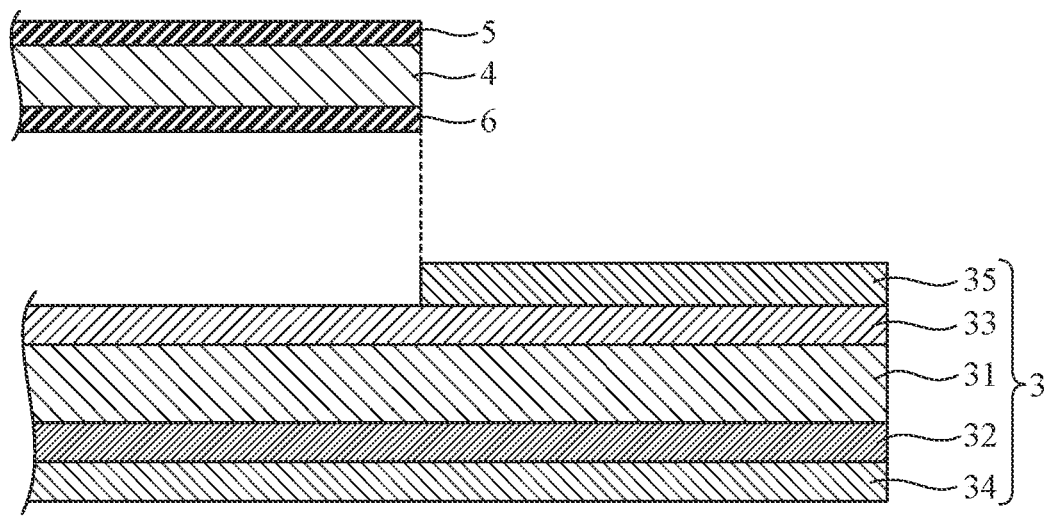
FIG. 3 is a cross-sectional view illustrating a positional relationship between the flexible printed circuit and a plate in the optical module according to the first embodiment.

An optical module according to a first embodiment will be described with reference to FIGS. 1 to 4.

Note that, in the drawings, the same reference numerals denote the same or corresponding parts.

An optical module targeted by the present disclosure is a CAN package type optical module of an optical transmission module on which a semiconductor laser for optical communication as a light-emitting element is mounted, an optical reception module on which a photodiode for optical communication as a light-receiving element is mounted, or an optical transmission and reception module on which the semiconductor laser for optical communication and the photodiode for optical communication are mounted.

In the first embodiment, the optical transmission module will be described as an example, but a relationship among a stem, a flexible printed circuit (FPC), a signal lead pin, a ground pin, and a plate is the same also in the optical reception module and the optical transmission and reception module.

The optical module includes an optical module body 1, a flexible printed circuit 3, and a plate 4.

The optical module body 1 includes a stem 10, a lens cap 11, a lens 12, a signal lead pin 13, a ground pin 14, a thermoelectric cooler 15, a base 16, a submount 17, a semiconductor light-emitting element 18 which is a semiconductor laser, a termination resistor 19, and a dielectric substrate 20.

The stem 10 is made of a disk-shaped metal, has an inner flat surface 10a and an outer flat surface 10b, and has a through hole 10c penetrating between the inner flat surface 10a and the outer flat surface 10b.

The stem 10 functions as a heat sink of the semiconductor light-emitting element 18, and the inner flat surface 10a is a region for component mounting.

Note that the stem 10 is not limited to the disk shape, and may have a circular column shape or a square column shape, and is only required to be a flat plate shape having the inner flat surface 10a and the outer flat surface 10b parallel to the inner flat surface 10a.

The lens cap 11 is formed of a cylindrical metal with an open end and having a bottomed portion and a side wall portion. In the bottomed portion of the lens cap 11, a lens attaching opening is formed, through which the lens 12 that is spherical and made of glass is mounted, that is, attached. The lens 12 is attached in the lens attaching opening of the bottomed portion in such a way that airtightness is maintained inside and outside the lens cap 11.

An end surface of the side wall portion of the lens cap 11, that is, an end surface with the open end is in contact with a peripheral end portion of the inner flat surface 10a of the stem 10 and fixed by a solder or the like. The end surface with the open end of the lens cap 11 is fixed to the inner flat surface 10a of the stem 10 in such a way that airtightness is maintained inside and outside the lens cap 11, also in the end surface with the open end. This fixing and attaching are performed at the end of the manufacturing process.

The stem 10 and the lens cap 11 constitute a CAN type package.

The signal lead pin 13 penetrates the through hole 10c of the stem 10, and is fixed to the stem 10 by an insulating glass 21 that is filled and solidified between the signal lead pin 13 and the through hole 10c. The insulating glass 21 electrically insulates the signal lead pin 13 from the stem 10, and seals the through hole 10c of the stem 10 to maintain airtightness in the CAN type package.

The signal lead pin 13 includes an inner lead portion 13a projecting from the inner flat surface 10a of the stem 10 and an outer lead portion 13b projecting from the outer flat surface 10b of the stem 10.

Although only the semiconductor light-emitting element 18 is illustrated in the drawing, a light-receiving element which is a photodiode that receives back surface light of the semiconductor light-emitting element 18 and monitors output light, and a temperature adjusting device that adjusts the temperature of the semiconductor light-emitting element 18 are also mounted in the CAN type package.

In addition, although not illustrated, there is also a power supply pin for the semiconductor laser 18, the light-receiving element, and the like, and the power supply pin is electrically insulated from the stem 10 and fixed similarly to the signal lead pin 13.

The ground pin 14 includes a pin portion 14a and a joint portion 14b having a diameter larger than a diameter of the pin portion 14a at an end of the pin portion 14a and joined to the outer flat surface 10b of the stem 10. The diameter of the pin portion 14a is the same as the diameter of the signal lead pin 13.

The ground pin 14 has a step between the pin portion 14a and the joint portion 14b, and the joint portion 14b is a step portion with respect to the pin portion 14a.

The joint surface of the joint portion 14b of the ground pin 14 and the outer flat surface 10b of the stem 10 are joined by welding.

The thermoelectric cooler 15 is mounted on the inner flat surface 10a of the stem 10 and cools the semiconductor light-emitting element 18. Heat that has cooled the semiconductor light-emitting element 18 is dissipated from the stem 10 to the outside. The thermoelectric cooler 15 is, for example, a Peltier element as a cooling element. Note that the thermoelectric cooler 15 is not necessarily required.

The tabular base 16 is vertically erected and fixed on the thermoelectric cooler 15. When the thermoelectric cooler 15 is not required, the base 16 is fixed upright perpendicular to the inner flat surface 10a of the stem 10.

The submount 17 is mounted, that is, attached on one flat surface of the base 16. The submount 17 is a ceramic substrate made of aluminum nitride having a thermal linear expansion coefficient close to that of the semiconductor light-emitting element 18.

The semiconductor light-emitting element 18 is mounted on one flat surface of the submount 17.

The semiconductor light-emitting element 18 is mounted, by die bonding with a solder, a conductive adhesive, or the like, on a first electrode connection region provided on the one flat surface of the submount 17 by vapor deposition or the like, and is placed and fixed on the one flat surface of the submount 17.

Thus, one electrode, that is, one signal terminal of the semiconductor light-emitting element 18 is electrically connected to the first electrode connection region.

Further, the other electrode, that is, the other signal terminal of the semiconductor light-emitting element 18 is electrically connected, by a gold wire 22a, to a second electrode connection region provided on the one flat surface of the submount 17 by vapor deposition or the like.

The termination resistor 19 is provided on the one flat surface of the submount 17 by vapor deposition or the like.

The termination resistor 19 is a resistor for impedance matching with an IC that drives the semiconductor light-emitting element 18, and is connected to the other signal terminal of the semiconductor light-emitting element 18 by a gold wire 22b.

The dielectric substrate 20 is mounted in the CAN type package, that is, disposed on the inner flat surface 10a of the stem 10, and a high frequency line connecting the semiconductor light-emitting element 18 and the signal lead pin 13 for the semiconductor light-emitting element 18 is formed by vapor deposition or the like.

The dielectric substrate 20 serves as a bridge substrate between the semiconductor light-emitting element 18 and the signal lead pin 13.

That is, the dielectric substrate 20 includes: a first signal line region connected, via a gold wire 22c, to the first electrode connection region to which the one signal terminal of the semiconductor light-emitting element 18 is connected; and a second signal line region connected, via a gold wire 22d, to the second electrode connection region to which the other signal terminal of the semiconductor light-emitting element 18 is connected, and the first signal line region and the second signal line region are connected to respective different signal lead pins 13 via gold wires (not illustrated).

The first signal line region and the second signal line region are different high frequency lines.

The semiconductor light-emitting element 18 receives a modulation signal from the signal lead pin 13 and emits laser light corresponding to the modulation signal. The laser light emitted from the semiconductor light-emitting element 18 is condensed or converted into parallel light via the lens 12, and is emitted to the outside.

The dielectric substrate 20 is not necessarily required. In a case where the dielectric substrate 20 is not required, the first electrode connection region to which the one signal terminal of the semiconductor light-emitting element 18 is connected and the second electrode connection region to which the other signal terminal of the semiconductor light-emitting element 18 is connected are connected directly to the respective different signal lead pins 13 via gold wires.

The flexible printed circuit 3 includes a flexible insulating substrate 31 of polyimide or the like, a wiring pattern 32 formed on a front surface of the insulating substrate 31 by vapor deposition or the like, a ground pattern 33 formed on a back surface of the insulating substrate 31 by vapor deposition or the like, a power supply wiring layer (not illustrated) formed on the front surface of the insulating substrate 31 by vapor deposition or the like, a front surface protective film 34, and a back surface protective film 35.

The wiring pattern 32 includes a plurality of signal wiring layers for transmitting a high frequency signal. A surface of the wiring pattern 32 is covered and protected by the front surface protective film 34.

In the insulating substrate 31, a first through hole 36 is formed at a position facing the signal lead pin 13 in the wiring pattern 32. As for the first through hole 36, as illustrated in FIG. 4, three first through holes 36a to 36c are arranged along a circumference in the first embodiment.

Figure 4:
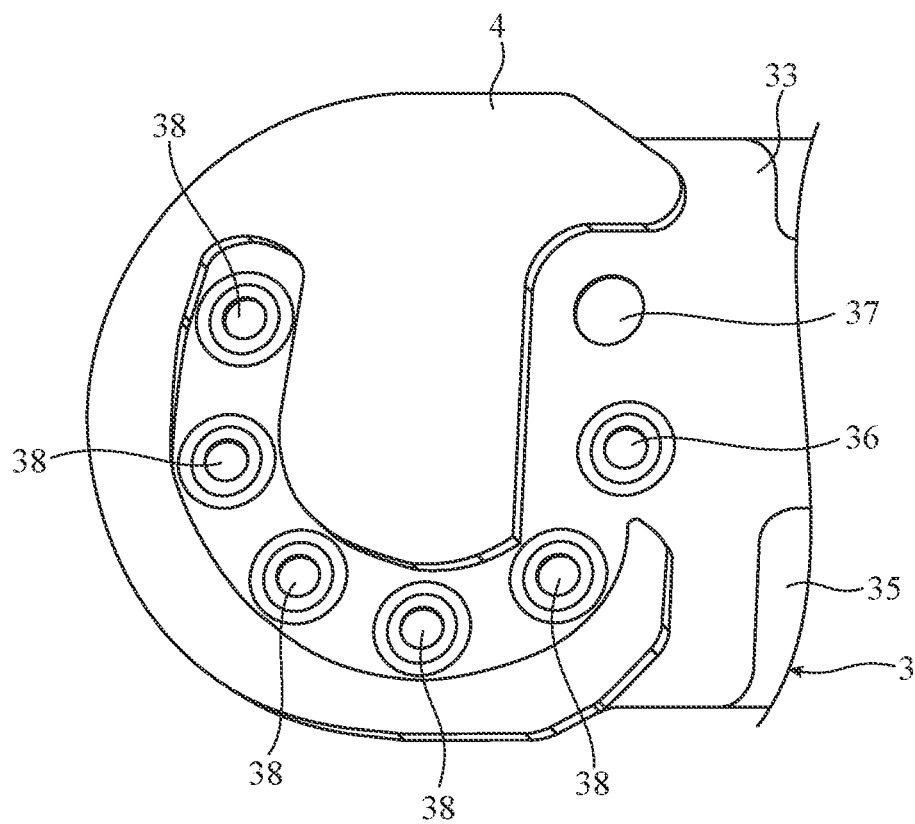
FIG. 4 is a plan view illustrating a positional relationship between the flexible printed circuit and the plate in the optical module according to the first embodiment.

That is, FIG. 4 illustrates an example in which the semiconductor light-emitting element 18, the light-receiving element, and the temperature adjusting device are mounted in the CAN type package, the signal lead pins 13 for the semiconductor light-emitting element 18, the light-receiving element, and the temperature adjusting device are provided, and the first through holes 36 corresponding to the respective signal lead pins 13 are formed.

Note that subscripts of reference numerals in the first through holes 36a to 36c may be omitted for simplicity of description.

In the first embodiment, the through hole has a conductive portion on an inner wall of the hole formed in the substrate, a front surface land on the front surface of the substrate, and a back surface land on the back surface, and the front surface land and the back surface land are electrically conducted by the conductive portion.

The outer lead portion 13b of the signal lead pin 13 penetrates the first through hole 36 in contact with the conductive portion, and a tip portion of the outer lead portion 13b of the signal lead pin 13 is electrically connected to the wiring pattern 32.

The tip portion of the outer lead portion 13b is fixed to the front surface land of the first through hole 36 by a solder 39, thereby electrically connecting the signal lead pin 13 to the wiring pattern 32 via the first through hole 36.

The ground pattern 33 is formed on substantially the entire back surface of the insulating substrate 31. The ground pattern 33 has an exposed surface at a position facing the outer flat surface of the stem 10, and a front surface excluding the exposed surface is covered and protected by the back surface protective film 35.

In the insulating substrate 31, a second through hole 37 is formed at a position facing the ground pin 14 on the exposed surface of the ground pattern 33.

The pin portion 14a of the ground pin 14 penetrates the second through hole 37 in contact with the conductive portion, and a tip portion of the pin portion 14a of the ground pin 14 is fixed to the front surface land of the second through hole 37 by a solder 40.

Consequently, the ground pin 14 is electrically connected to the ground pattern 33 via the front surface land, the conductive portion, and the back surface land of the second through hole 37.

In the insulating substrate 31, a third through hole 38 is formed at a position where the power supply pin faces.

An outer lead portion of the power supply pin penetrates the third through hole 38 in contact with the conductive portion, and a tip portion of the outer lead portion of the power supply pin is electrically connected to a power supply pattern.

The tip portion of the outer lead portion of the power supply pin is fixed to the front surface land of the third through hole 38 by a solder, thereby electrically connecting the power supply pin to the power supply pattern via the third through hole 38.

The plate 4 is a flat plate-shaped metal having a flat front surface and back surface, and the back surface is joined to the outer flat surface 10b of the stem 10, and the front surface is joined to the exposed surface of the ground pattern 33 of the flexible printed circuit 3.

As illustrated in FIG. 4, a planar shape of the plate 4 is a shape whose outer shape conforms to an outer shape of the outer flat surface 10b of the stem 10, and from which a surface through which the signal lead pin 13 and the ground pin 14 pass separately is removed.

That is, the plate 4 is formed by continuously hollowing a disk-shaped metal at a portion through which the signal lead pin 13, the ground pin 14, and the power supply pin pass. Note that the plate 4 may be made of a disk-shaped metal with a hole formed in a portion through which each of the signal lead pin 13, the ground pin 14, and the power supply pin passes.

FIG. 4 illustrates the first through hole 36, the second through hole 37, and the third through holes 38.

The back surface of the plate 4 and the outer flat surface 10b of the stem 10 are joined by a conductive tape 5. By the conductive tape 5, the plate 4 is fixed to the stem 10, and the plate 4 and the stem 10 are electrically connected.

Note that the back surface of the plate 4 and the outer flat surface 10b of the stem 10 may be joined and fixed by another conductive material instead of the conductive tape 5.

The front surface of the plate 4 and the exposed surface of the ground pattern 33 of the flexible printed circuit 3 are bonded by a conductive adhesive 6. The plate 4 is fixed to the flexible printed circuit 3 by the conductive adhesive 6, and the plate 4 and the ground pattern 33 are electrically connected.

Note that, instead of the conductive adhesive 6, the front surface of the plate 4 and the exposed surface of the ground pattern 33 of the flexible printed circuit 3 may be bonded and fixed by another conductive material.

The stem 10 is electrically connected to the ground pattern 33 of the flexible printed circuit 3 via the conductive tape 5, the plate 4, and the conductive adhesive 6, and the stem 10 and the ground pattern 33 have a common ground.

As described above, the optical module according to the first embodiment is the optical module including the ground pin 14 in which the tip portion of the pin portion 14a is electrically connected to the ground pattern 33 of the flexible printed circuit 30, and which includes the joint portion 14b having the diameter larger than the diameter of the pin portion 14a at an end of the pin portion 14a and joined to the outer flat surface 10b of the stem 10, in which the stem 10 and the exposed surface of the ground pattern 33 are electrically and mechanically connected with the plate 4 made of metal interposed between the stem and the exposed surface, so that the diameter of the through hole 37 for the ground pin 14 can be set to a size that matches the diameter of the pin portion 14a, and the degree of freedom in wiring design in the flexible printed circuit 30 is not impaired.

That is, it is not necessary to increase the diameter of the through hole 37 for the ground pin 14 to match the joint portion 14b having a diameter larger than the diameter of the pin portion 14a, and the degree of freedom in wiring design is not hindered.

The tip portion of the outer lead portion 13b of the signal lead pin 13 is fixed to the front surface land of the first through hole 36 by the solder 39, the tip portion of the pin portion 14a of the ground pin 14 is fixed to the front surface land of the second through hole 37 by the solder 40, whereby the flexible printed circuit 30, the plate 4, and the stem 10 are firmly adhered to each other.

As a consequence, by using the conductive tape 5 and the conductive adhesive 6, the electrical and mechanical connection between the stem 10 and the ground pattern 33 can be surely and firmly maintained.

The plate 4 is bonded to the exposed surface of the ground pattern 33 of the flexible printed circuit 30 with the conductive adhesive 6, the conductive tape 5 is attached to the front surface of the plate 4 bonded to the flexible printed circuit 30, and the stem 10 is bonded to the plate 4 with the conductive tape 5, so that the optical module can be assembled without adding a hand to the optical module body 1 and the flexible printed circuit 3.

Moreover, since the stem 10 is fixed to the flexible printed circuit 3 with the conductive tape 5 and the conductive adhesive 6, it is easy to perform soldering 39 of the tip portion of the outer lead portion 13b of the signal lead pin 13 and the front surface land of the first through hole 36, and soldering 40 of the tip portion of the pin portion 14a of the ground pin 14 and the front surface land of the second through hole 37.

Furthermore, since the stem 10 and the ground pattern 33 of the flexible printed circuit 30 are electrically connected to the ground potential by the plate 4 made of metal, the ground potential near the signal lead pin 13 is strengthened, and parallel plate resonance due to the stem 10 and the ground pattern 33 of the flexible printed circuit 30 can be suppressed.

In order to verify that the parallel plate resonance is suppressed, a pass characteristic S21 with respect to the frequency in the optical module according to the first embodiment has been calculated.

For comparison, the pass characteristic S21 with respect to the frequency in the optical module in which not the plate 4 made of metal but an insulator plate made of polyimide is used has been also calculated.

Figure 5:
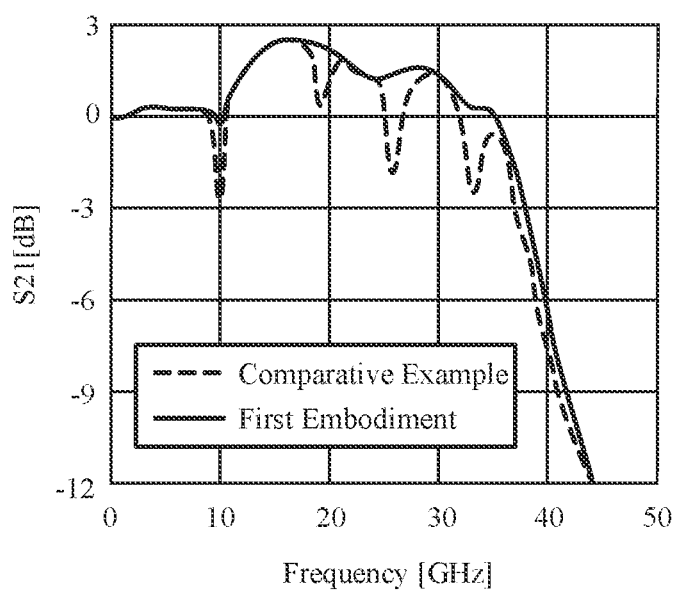
FIG. 5 is a diagram illustrating frequency characteristics in the optical module according to the first embodiment.

The calculation results are illustrated in FIG. 5.

In FIG. 5, a horizontal axis represents the frequency, a vertical axis represents the pass characteristic S21, a solid line represents a calculation result in the optical module according to the first embodiment, and a dotted line represents a calculation result in a comparative example.

As can be understood from FIG. 5, it can be seen that the pass characteristic S21 with respect to the frequency in the optical module according to the first embodiment is better than the pass characteristic S21 with respect to the frequency in the comparative example.

That is, in the optical module according to the first embodiment, the stem 10 and the exposed surface of the ground pattern 33 of the flexible printed circuit 30 are electrically and mechanically connected with the plate 4 made of metal interposed between the stem and the exposed surface, so that resonance and multiple reflection between the stem 10 and the ground pattern 33 can be suppressed, and good frequency characteristics are obtained.

Note that, in the present invention, it is possible to modify any component of the embodiment or omit any component in the embodiment within the scope of the invention.

INDUSTRIAL APPLICABILITY

As shown in the first embodiment, an optical module according to the present disclosure can be used as an optical transmission module for optical communication, and can be used as an optical reception module for optical communication on which a light-receiving element is mounted, and as an optical transmission and reception module on which both a light-emitting element and a light-receiving element are mounted.

REFERENCE SIGNS LIST

1: optical module body, 10: stem, 10a: inner flat surface, 10b: outer flat surface, 10c: through hole, 13: signal lead pin, 13a: inner lead portion, 13b: outer lead portion, 14: ground pin, 14a: pin portion, 14b: joint portion, 18: semiconductor light-emitting element, 20: dielectric substrate, 3: flexible printed circuit, 31: insulating substrate, 32: wiring pattern, 33: ground pattern, 36a to 36c: first through hole, 37: second through hole, 4: plate, 5: conductive tape, 6: conductive adhesive

The invention claimed is:
1. An optical module, comprising:
a stem made of metal having an inner flat surface and an outer flat surface and having a through hole formed to penetrate between the inner flat surface and the outer flat surface;
a signal lead pin that penetrates the through hole of the stem, is electrically insulated and fixed to the stem, and includes an inner lead portion projecting from the inner flat surface of the stem and an outer lead portion projecting from the outer flat surface of the stem;
a ground pin including a pin portion, and at an end of the pin portion, a joint portion having a diameter larger than a diameter of the pin portion and joined to the outer flat surface of the stem;

a flexible printed circuit including a wiring pattern on a front surface and a ground pattern having an exposed surface at a position facing the outer flat surface of the stem on a back surface, wherein a first through hole is formed at a position facing the signal lead pin in the wiring pattern, the outer lead portion of the signal lead pin penetrates the first through hole, a tip portion of the outer lead portion of the signal lead pin is electrically connected to the wiring pattern, a second through hole is formed at a position facing the ground pin in the exposed surface of the ground pattern, the pin portion of the ground pin penetrates the second through hole, and a tip portion of the pin portion of the ground pin is electrically connected to the second through hole on the front surface; and a plate made of metal having a back surface joined to the outer flat surface of the stem and a front surface joined to the exposed surface of the ground pattern.

2. The optical module according to claim 1, wherein the exposed surface of the ground pattern and the front surface of the plate are bonded by a conductive adhesive, and the outer flat surface of the stem and the back surface of the plate are bonded by a conductive tape.

3. The optical module according to claim 1, wherein a planar shape of the plate is a shape in which an outer shape conforms to an outer shape of the outer flat surface of the stem, and from which a surface through which the signal lead pin and the ground pin pass separately is removed.

4. The optical module according to claim 1, wherein
a semiconductor light-emitting element, a light-receiving element, and a temperature adjusting device are mounted in a CAN type package including the stem and a lens cap fixed in contact with a peripheral end portion of the inner flat surface of the stem, and
the signal lead pin is configured as a signal lead pin for the semiconductor light-emitting element.

5. The optical module according to claim 4, wherein a dielectric substrate having a high frequency line connecting between the semiconductor light-emitting element and the signal lead pin for the semiconductor light-emitting element is mounted in the CAN type package.

* * * * *